US009646531B2

(12) United States Patent
Yamazaki et al.

(10) Patent No.: US 9,646,531 B2
(45) Date of Patent: May 9, 2017

(54) ELEMENT SUBSTRATE AND LIGHT EMITTING DEVICE

(75) Inventors: Yu Yamazaki, Tokyo (JP); Aya Anzai, Kanagawa (JP); Mitsuaki Osame, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1936 days.

(21) Appl. No.: 12/052,801

(22) Filed: Mar. 21, 2008

(65) Prior Publication Data

US 2008/0169765 A1 Jul. 17, 2008

Related U.S. Application Data

(62) Division of application No. 10/840,611, filed on May 7, 2004, now Pat. No. 7,358,942.

(30) Foreign Application Priority Data

May 16, 2003 (JP) ................................. 2003-139583
Jun. 18, 2003 (JP) ................................. 2003-174050

(51) Int. Cl.
*G09G 3/32* (2016.01)
*G09G 3/3233* (2016.01)
(Continued)

(52) U.S. Cl.
CPC ......... *G09G 3/3233* (2013.01); *G09G 3/2022* (2013.01); *G09G 3/3266* (2013.01);
(Continued)

(58) Field of Classification Search
CPC ........ G09G 3/30; G09G 3/32; H01L 27/3295; H01L 2251/5323
(Continued)

(56) References Cited

U.S. PATENT DOCUMENTS 6,229,506 B1 * 5/2001 Dawson et al. ................. 345/82
6,501,466 B1 * 12/2002 Yamagishi et al. ........... 345/204
(Continued)

FOREIGN PATENT DOCUMENTS

EP  1 607 931 A1  12/2005
JP  2004-327431 A  11/2004
(Continued)

OTHER PUBLICATIONS

Mizukami et al.; "36.1: 6-Bit Digital VGA OLED"; *SID 00 Digest*; pp. 912-915; 2000.
(Continued)

*Primary Examiner* — William Boddie
*Assistant Examiner* — Leonid Shapiro
(74) *Attorney, Agent, or Firm* — Fish & Richardson P.C.

(57) ABSTRACT

A light emitting device and an element substrate which are capable of suppressing variations in luminance intensity of a light emitting element among pixels due to characteristic variations of a driving transistor without suppressing off-current of a switching transistor low and increasing storage capacity of a capacitor. A gate potential of a driving transistor is connected to a first scan line or a second scan line, and the driving transistor operates in a saturation region. A current controlling transistor which operates in a linear region is connected in series to the driving transistor. A video signal which transmits a light emission or non-emission of a pixel is input to the gate of the current controlling transistor through a switching transistor.

16 Claims, 21 Drawing Sheets

(51) Int. Cl.
  *G09G 3/20* (2006.01)
  *G09G 3/3266* (2016.01)
  *G09G 3/3291* (2016.01)
  *H01L 27/32* (2006.01)
  *H01L 51/52* (2006.01)

(52) U.S. Cl.
  CPC ... *G09G 3/3291* (2013.01); *G09G 2300/0426* (2013.01); *G09G 2300/0814* (2013.01); *G09G 2300/0842* (2013.01); *G09G 2300/0861* (2013.01); *G09G 2310/0251* (2013.01); *G09G 2320/0233* (2013.01); *H01L 27/322* (2013.01); *H01L 27/3244* (2013.01); *H01L 27/3295* (2013.01); *H01L 51/5221* (2013.01); *H01L 51/5234* (2013.01); *H01L 2251/5323* (2013.01)

(58) Field of Classification Search
  USPC .......................................... 345/82, 55, 204
  See application file for complete search history.

(56) References Cited

U.S. PATENT DOCUMENTS

| | | | |
|---|---|---|---|
| 6,590,554 B1* | 7/2003 | Takayama | 345/204 |
| 7,141,934 B2 | 11/2006 | Osame | |
| 7,173,586 B2 | 2/2007 | Osame | |
| 7,218,294 B2 | 5/2007 | Koyama et al. | |
| 2002/0047839 A1* | 4/2002 | Kasai | G09G 3/3233 345/211 |
| 2003/0090447 A1 | 5/2003 | Kimura | |
| 2003/0098829 A1* | 5/2003 | Chen | G09G 3/3241 345/82 |
| 2003/0122805 A1* | 7/2003 | So | G09G 3/3258 345/204 |
| 2003/0164685 A1* | 9/2003 | Inukai | 315/169.3 |
| 2003/0197663 A1* | 10/2003 | Lee et al. | 345/76 |
| 2003/0222589 A1 | 12/2003 | Osame | |
| 2004/0252565 A1 | 12/2004 | Yamazaki et al. | |
| 2004/0263066 A1 | 12/2004 | Abe et al. | |
| 2005/0012686 A1 | 1/2005 | Osame | |
| 2007/0085796 A1 | 4/2007 | Osame | |
| 2007/0132677 A1 | 6/2007 | Osame | |
| 2007/0177088 A1 | 8/2007 | Koyama et al. | |
| 2009/0179549 A1 | 7/2009 | Abe et al. | |

FOREIGN PATENT DOCUMENTS

| | | |
|---|---|---|
| JP | 2004-347625 A | 12/2004 |
| JP | 2004-347626 A | 12/2004 |
| JP | 2004-361424 A | 12/2004 |
| JP | 2005-037413 A | 2/2005 |
| WO | 2004/086343 A1 | 10/2004 |

OTHER PUBLICATIONS

Inukai et al.; "36.4L: *Late-News Paper*: 4.0-in. TFT-OLED Displays and a Novel Digital Driving Method"; *SID 00 Digest*; pp. 924-927; 2000.

* cited by examiner writing pulse erasing pulse 1 erasing pulse 2

ELEMENT SUBSTRATE AND LIGHT EMITTING DEVICE

BACKGROUND OF THE INVENTION

1. Field of the Invention

The present invention relates to a light emitting device comprising a plurality of pixels each including a light emitting element and a means for supplying current to the light emitting element.

2. Description of the Related Art

Since a light emitting element emits light by itself, it is highly visible and does not require a back light which is needed in a liquid crystal display device (LCD). Therefore, it is suitably applied to thin devices and not restricted in viewing angle. Because of these advantages, a light emitting device having a light emitting element has recently been drawing attentions as an alternative display device to a CRT and an LCD. It is to be noted that a light emitting element in this specification indicates an element whose luminance is controlled by current or voltage, and it includes an OLED (Organic Light Emitting Diode) or an MIM electron source element (electron discharge element) and the like which is used in an FED (Field Emission Display).

Also, a light emitting device of the invention includes a panel and a module obtained by mounting an IC or the like onto the panel. More generally, the invention relates to an element substrate which corresponds to the condition before the completion of a panel in manufacturing steps of the light emitting device, and the element substrate comprises a plurality of pixels each having a unit for supplying current to a light emitting element.

OLED which is one of the light emitting elements includes an anode layer, a cathode layer, and a layer containing an electroluminescent material (hereinafter referred to as an electroluminescent layer) that generates luminescence (electroluminescence) when an electric field is applied thereto. The electroluminescent layer is provided between the anode and cathode, and it comprises a single or multiple layers. These layers may contain an inorganic compound. The electroluminescence in the electroluminescent layer includes a light emission (fluorescence) when a singlet exciting state returns to a ground state and a light emission (phosphorescence) when a triplet exciting state returns to a ground state.

The pixel configuration of a general light emitting device and its drive are described now in brief. A pixel shown in FIG. 7 comprises a switching transistor 700, an erasing transistor 708, a driving transistor 701, a capacitor 702, and a light emitting element 703. The gate of the switching transistor 700 is connected to a first scan line 705. Either the source or drain of the switching transistor 700 is connected to a signal line 704, and the other is connected to the gate of the driving transistor 701. The source of the driving transistor 701 is connected to a power supply line 706, and the drain thereof is connected to the anode of the light emitting element 703. The gate of the erasing transistor 708 is connected to a second scan line 709, the source thereof is connected to the power supply line 706, and the drain thereof is connected to the gate of the driving transistor 701. The cathode of the light emitting element 703 is connected to a counter electrode 707. The capacitor 702 is provided for storing a potential difference between the gate and source of the driving transistor 701. Also, the predetermined voltages are each applied to the power supply line 706 and the counter electrode 707 from a power supply and each has a potential difference.

When the switching transistor 700 is turned ON by a signal from the first scan line 705, a video signal that is input to the signal line 704 is input to the gate of the driving transistor 701. The potential difference between a potential of the input video signal and that of the power supply line 706 corresponds to a gate-source voltage Vgs of the driving transistor 701. Thus, current is supplied to the light emitting element 703, and the light emitting element 703 emits light by using the supplied current.

SUMMARY OF THE INVENTION

A transistor using polysilicon has high field effect mobility and large on-current. Therefore, it is suited for a light emitting device. However, the transistor using polysilicon has problems in that it is likely to have variations in characteristics due to a defect in a crystal grain boundary.

In the pixel shown in FIG. 7, when the size of the drain current of the driving transistor 701 varies among pixels, the luminance intensity of the light emitting element 703 varies even with the same potential of a video signal.

In order to control variations in drain current, there is a method for designing an L/W (L: channel length, W: channel width) of the driving transistor 701 large as disclosed in US 2003/0222589. The drain current Ids of the driving transistor 701 in a saturation region is expressed by the following formula 1.

$$Ids=\beta(Vgs-Vth)^2/2 \qquad \text{[formula 1]}$$

It is apparent from the formula 1 that the drain current Ids of the driving transistor 701 in the saturation region is easily fluctuated even by small variations in the gate-source voltage Vgs. Therefore, it is necessary to keep the gate-source voltage Vgs, which is stored between the gate and source of the driving transistor 701, not to vary while the light emitting element 701 emits light. Thus, storage capacity of the capacitor 702 which is disposed between the gate and source of the driving transistor 701 is required to be increased, and off-current of the switching transistor 700 and of the erasing transistor 708 is required to be suppressed low.

It is quite difficult to suppress off-current of the switching transistor 700 and of the erasing transistor 708 low while increasing on-current thereof for charging large capacitance in the fabrication process of the transistor.

Also, there is another problem that the gate-source voltage Vgs of the driving transistor 701 varies due to the switching of the switching transistor 700 and of the erasing transistor 708, potential changes in the signal line and in the scan line, and the like. This derives from the parasitic capacitance of the gate of the driving transistor 701.

In view of the foregoing problems, the invention provides a light emitting device and an element substrate which are not easily influenced by parasitic capacitance and capable of suppressing variations in luminance intensity of the light emitting element 703 among pixels due to characteristic variations of the driving transistor 701 without suppressing off-current of the switching transistor 700 and of the erasing transistor 708 low and increasing storage capacity of the capacitor 702.

According to the invention, the gate of a driving transistor is connected to a first or a second scan line. When the gate of the driving transistor is connected to the first scan line, the driving transistor is ON and operates in a saturation region to flow current while a switching transistor is OFF. On the other hand, when the gate of the driving transistor is connected to the second scan line, the driving transistor is ON and operates in a saturation region to flow current while an erasing transistor is OFF. Furthermore, by disposing a current controlling transistor which operates in a linear region in series to the driving transistor, a video signal transmitting either a light emission or non-emission of a pixel is input to the gate of the current controlling transistor through the switching transistor.

Since the current controlling transistor operates in a linear region, its source-drain voltage Vds is small, and small changes in a gate-source voltage Vgs of the current controlling transistor do not influence the current supplied to a light emitting element. Current supplied to the light emitting element is determined by the driving transistor which operates in a saturation region. A gate potential of the driving transistor corresponds to a potential of the second scan line, and a source potential of the driving transistor corresponds to a drain potential of the current controlling transistor. The gate-source voltage Vgs of the driving transistor is steady while the light emitting element emits light. Current supplied to the light emitting element is not influenced even without increasing storage capacity of a capacitor which is disposed between the gate and source of the current controlling transistor nor suppressing off-current of the switching transistor low. In addition, it is not influenced by the parasitic capacitance of the gate of the current controlling transistor either. Therefore, cause of variation is decreased, and image quality is thus enhanced to a great extent.

In addition, as there is no need to suppress off-current of the switching transistor low, manufacturing process of the transistor can be simplified, which contributes greatly to the cost reduction and improvement in yield.

DETAILED DESCRIPTION OF THE INVENTION

Embodiment Mode

Embodiment Mode 1

Figure 1:
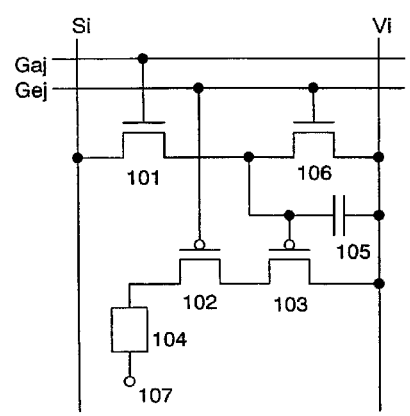
FIG. 1 shows an embodiment mode of the invention.

FIG. 1 shows an embodiment mode of a pixel of the light emitting device of the invention. The pixel shown in FIG. 1 comprises a light emitting element 104, a transistor (switching transistor) 101 used as a switching element for controlling a video signal input to the pixel, a driving transistor 102 for controlling a current value flowing in the light emitting element 104, a current controlling transistor 103 for controlling a current supply (or controlling a light emission or non-emission) to the light emitting element 104, and a transistor (erasing transistor) 106 for turning OFF the current controlling transistor 103 forcibly. In addition, it is also possible to dispose a capacitor 105 for storing a potential of a video signal as shown in this embodiment mode.

The driving transistor 102 and the current controlling transistor 103 have the same polarity, while the erasing transistor 106 and the driving transistor 102 have the opposite polarity to each other. In addition, each of the switching transistor 101 and the erasing transistor 106 may be either an N-channel transistor or a P-channel transistor.

According to the invention, the driving transistor 102 operates in a saturation region and the current controlling transistor 103 operates in a linear region.

The channel length (L) of the driving transistor 102 may be longer than its channel width (W), and L of the current controlling transistor 103 may be equal to or shorter than its W. Desirably, the ratio of L to W (L/W) of the driving transistor 102 is five or more. Furthermore, assuming that L of the driving transistor 102 is L1 and W thereof is W1, and L of the current controlling transistor 103 is L2 and W thereof is W2, when L1/W1:L2/W2=X:1 is satisfied, X is desirably in the range from 5 to 6000. For example, it is desirable that L1/W1=500 μm/3 μm, and L2/W2=3 μm/100 μm.

The driving transistor 102 may be either an enhancement mode transistor or a depletion mode transistor.

The gate of the switching transistor 101 is connected to a first scan line Gaj (j=1 to y). Either the source or drain of the switching transistor 101 is connected to a signal line Si (i=1 to x), and the other is connected to the gate of the current controlling transistor 103. The gate of the erasing transistor 106 is connected to a second scan line Gej (i=1 to y). Either the source or drain of the erasing transistor 106 is connected to a power supply line Vi (i=1 to x), and the other is connected to the gate of the current controlling transistor 103. The gate of the driving transistor 102 is connected to the second scan line Gej (i=1 to y). The driving transistor 102 and the current controlling transistor 103 are each connected to the power supply line Vi (i=1 to x) and the light emitting element 104 so that current supplied from the power supply line Vi (i=1 to x) is supplied to the light emitting element 104 as a drain current of the driving transistor 102 and of the current controlling transistor 103. In this embodiment mode, the source of the current controlling transistor 103 is connected to the power supply line Vi (i=1 to x) and the drain of the driving transistor 102 is connected to a pixel electrode of the light emitting element 104.

It is to be noted that the source of the driving transistor 102 may be connected to the power supply line Vi (i=1 to x), and the drain of the current controlling transistor 103 may be connected to the pixel electrode of the light emitting element 104.

The light emitting element 104 comprises an anode, a cathode, and an electroluminescent layer interposed between the anode and cathode. As shown in FIG. 1, when the anode of the light emitting element 104 is connected to the driving transistor 102, the anode is a pixel electrode and the cathode is a counter electrode. The counter electrode 107 is connected to a common power source in all pixels, and a potential difference is given between the power supply line Vi (i=1 to x) and the counter electrode 107 so that a forward bias is applied between anode and cathode of the light emitting element 104.

One of the two electrodes of the capacitor 105 is connected to the power supply line Vi (i=1 to x), and the other is connected to the gate of the current controlling transistor 103. The capacitor 105 is disposed so as to store a potential difference between the electrodes of the capacitor 105 when the switching transistor 101 is not selected (OFF state). It is to be noted that although FIG. 1 shows a configuration disposing the capacitor 105, the invention is not limited to this and an alternative configuration without the capacitor 105 may be employed as well.

In FIG. 1, each of the driving transistor 102 and the current controlling transistor 103 is a P-channel transistor, and the drain of the driving transistor 102 is connected to the anode of the light emitting element 104. On the contrary, in the case where each of the driving transistor 102 and the current controlling transistor 103 is an N-channel transistor, the source of the driving transistor 102 is connected to the cathode of the light emitting element 104. In this case, the cathode of the light emitting element 104 is a pixel electrode and the anode thereof is a counter electrode 107. The counter electrode 107 is connected to a power supply line.

Figure 19A:
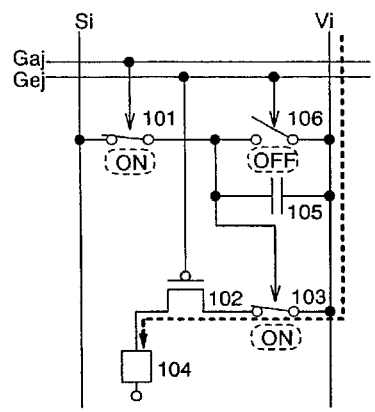
FIGS. 19A to 19D each show a driving method of a pixel of the invention.
Figure 19B:
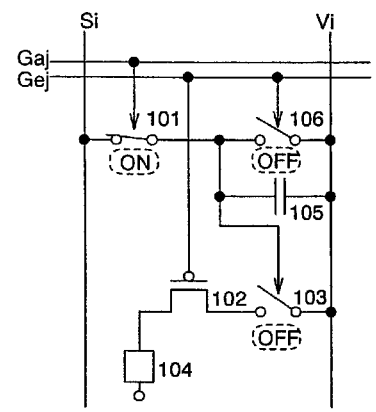
Figure 19C:
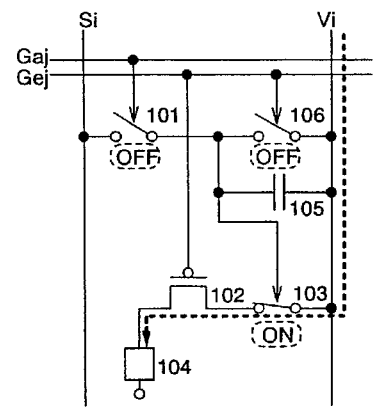
Figure 19D:
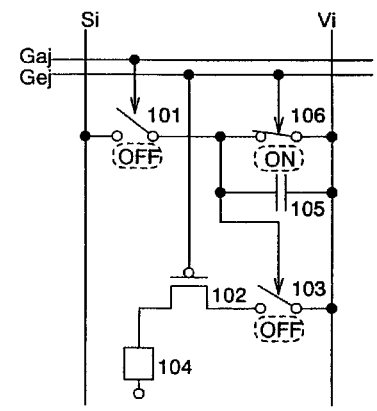

A driving method of the pixel shown in FIG. 1 is described now. The operation of the pixel shown in FIG. 1 can be divided into a writing period, a data storage period, and an erasing period. FIG. 19A shows an operation in the case where the driving transistor 102 and the current controlling transistor 103 are turned ON by a video signal in the writing period. FIG. 19B shows an operation in the case where the current controlling transistor 103 is turned OFF in the writing period. FIG. 19C shows an operation in the case where the driving transistor 103 is turned ON in the data storage period, and FIG. 19D shows an operation in the erasing period. It is to be noted that, for ease of description, each of the switching transistor 101 used as a switching element, the current controlling transistor 103, and the erasing transistor 106 is indicated by a switch in FIGS. 19A to 19D.

First, in the writing period, the switching transistor 101 whose gate is connected to the first scan line Gaj (j=1 to y) is turned ON by controlling the potential of the first scan line Gaj (j=1 to y). Then, video signals which are input to signal lines S1 to Sx are input to the gate of the current controlling transistor 103 through the switching transistor 101. At this time, the erasing transistor 106 whose gate is connected to the second scan line Gej (j=1 to y) is OFF, and the driving transistor 102 is ON since the polarity thereof is different from that of the erasing transistor 106.

When the current controlling transistor 103 is turned ON by a video signal, current is supplied to the light emitting element 104 through the current supply line Vi (i=1 to x) as shown in FIG. 19A. At this time, the current controlling transistor 103 operates in a linear region, thus current supplied to the light emitting element 104 is determined by V-I characteristics of the driving transistor 102 operating in a saturation region and the light emitting element 104. The light emitting element 104 emits light at luminance corresponding to the size of the supplied current.

Meanwhile, when the current controlling transistor 103 is turned OFF by a video signal as shown in FIG. 19B, no current is supplied to the light emitting element 104, thus it does not emit light.

In the data storage period, the switching transistor 101 is turned OFF by controlling the potential of the first scan line Gaj (j=1 to y), thereby storing a potential of the video signal that has been written to the gate of the current controlling transistor 103 in the writing period. A potential of the second scan line Gej (j=1 to y) remains unchanged from the writing period. In the writing period, when the current controlling transistor 103 is turned ON, a potential of the video signal is stored in the capacitor 105; therefore, the current supply to the light emitting element 104 is kept on as shown in FIG. 19C. On the contrary, when the current controlling transistor 103 is turned OFF in the writing period, a potential of the video signal is stored in the capacitor 105; therefore, current is not supplied to the light emitting element 104.

In the erasing period, as shown in FIG. 19D, the erasing transistor 106 is turned ON and the driving transistor 102 is turned OFF by controlling the potential of the second scan line Gej (j=1 to y). Since a potential of the current supply line Vi (i=1 to x) is supplied to the gate of the current controlling transistor 103 through the erasing transistor 106, the current controlling transistor 103 is turned OFF. Therefore, the light emitting element 104 during this period is supplied with no current from the power supply line Vi (i=1 to x).

The gate potential of the current controlling transistor 103 is stored; therefore, the erasing transistor 106 may be held ON constantly during the erasing period or it may be turned ON for a shorter period than the erasing period.

The gate of the driving transistor 102 may be connected to the second scan line in the preceding row or to the second scan line in the subsequent row.

According to the aforementioned configuration, a source-drain voltage Vds of the current controlling transistor 103 is small as it operates in a linear region; therefore, small changes in the gate-source voltage Vgs of the current controlling transistor 103 do not influence the current supplied to the light emitting element 104. Current supplied to the light emitting element 104 is determined by the driving transistor 102 which operates in a saturation region. Therefore, it is not influenced even without increasing storage capacity of the capacitor 105 which is disposed between the gate and source of the current controlling transistor 103 or suppressing off-current of the switching transistor 101 low. In addition, it is not influenced by the parasitic capacitance of the gate of the current controlling transistor 103 either. Therefore, cause of variation is decreased, and image quality is thus enhanced to a great extent.

Figure 20:
FIG. 20 shows driving methods of an active matrix light emitting device.

It is to be noted that since an active matrix light emitting device can maintain the current supply to a light emitting element to some extent even after a video signal input, a larger size and higher definition of a panel can be realized, which is becoming the mainstream in recent years. The specific pixel configurations of an active matrix light emitting device which are proposed are different depending on manufacturing corporations of light emitting devices, and various technologies with distinctive characteristics have been studied and developed by them. FIG. 20 is a schematic diagram showing the classification of driving methods of an active matrix display device.

As shown in FIG. 20, driving method of an active matrix light emitting device is roughly classified into two: the one with digital video signals and the one with analog digital signals. Furthermore, an analog light emitting device is classified into a current modulation type in which the current value supplied to a light emitting element is modulated in an analog manner, and a time modulation type in which the gray scale is displayed by changing the ON/OFF periods of an inverter. A light emitting device of the current modulation type can also be classified into the one having a Tr characteristic correction circuit, and the one having no Tr characteristic correction circuit. The Tr characteristic correction circuit is a circuit for correcting characteristic variations of driving transistors, which includes a circuit for correcting only the threshold voltage or a circuit for correcting the current value (including the threshold voltage, the mobility, and all the other like).

The light emitting device having the Tr characteristic correction circuit which is classified as the current modulation type is further classified into the one in which the threshold voltage is corrected by a voltage programming and the one in which the current value is corrected by a current programming. In the voltage programming, video signals are input with voltage, thereby correcting variations in the threshold voltage of a driving transistor. On the other hand, in the current programming, video signals are input with current, thereby correcting variations in the current value (including the threshold voltage, the mobility, and all the other like) of a driving transistor. Since a light emitting element is a current driving element and its luminance intensity is determined by a current value, current may be directly used as the data.

The light emitting device in which the current value is corrected by a current programming is further classified into a current mirror type and non-current mirror type. In the light emitting device of the current mirror type, a transistor for setting current and a transistor for supplying current to a light emitting element are separately disposed in a pixel circuit using a current mirror circuit. It is an initial premise that the two transistors are required to have the identical characteristics. In the light emitting device of the non-current mirror type, a current mirror circuit is not used and current setting and current supply to a light emitting element are controlled by using one transistor.

On the other hand, a digital light emitting device is classified into the one using an area gray scale method and the one using a time gray scale method. According to the area gray scale method, each pixel includes sub-pixels whose light emission area is sectioned by the square as 1:2:4:8: and . . . , thus the gray scale is displayed by selecting them. According to the time gray scale method, one frame includes several sub-frames whose light emission period is sectioned by the square as 1:2:4:8: and . . . , thus the gray scale is displayed by selecting them.

The time gray scale method is also classified into a DPS (Display Period Separated) drive and an SES (Simultaneous Erasing Scan) drive. According to the DPS drive, each sub-frame includes two periods: a data writing period (Addressing Period) and a light emission period (Lighting Period). The DPS drive is disclosed in "M. Mizukami, et al., 6-Bit Digital VGA OLED, SID '00 Digest, p. 912-915".

According to the SES drive, a data writing period and a light emission period can be overlapped with each other by using an erasing transistor, thus a light emitting element can emit light for a longer period. The SES drive is disclosed in "K. Inukai, et al., 4.0-in. TFT-OLED Displays and a Novel Digital Driving Method, SID '00 Digest, p. 924-927".

The SES drive is further classified into a constant current drive and a constant voltage drive. According to the constant current drive, a light emitting element is driven at a constant current, in which a current can be supplied constantly without being influenced by the resistance change of a light emitting element. According to the constant voltage drive, a light emitting element is driven at a constant voltage.

The constant current drive light emitting device is classified into the one having a Tr characteristic correction circuit, and the one having no Tr characteristic correction circuit. As a light emitting device having the Tr characteristic correction circuit, there is a light emitting device of a drive (CCT1) as disclosed in US 2003/0090447 and a light emitting device of a drive (CCSP) as disclosed in US 2003/0164685. The light emitting device having no Tr characteristic correction circuit is further classified into the one comprising a driving transistor with a long channel length and the one using a gate potential fixation method during light emission. The display device comprising a driving transistor with a long channel length is disclosed in US 2003/0222589. According to the display device comprising a driving transistor with a long channel length, characteristic variations of driving transistors at a constant current drive is suppressed. When the gate length is made drastically long, Vgs in the vicinity of the threshold voltage is not used, thus it becomes possible to reduce variations in current supplied to a light emitting element in each pixel.

According to the gate potential fixation method during light emission, a gate potential of a driving transistor is fixed at a potential which can turn ON the driving transistor while a light emitting element emits light, thus Vgs of the driving transistor is maintained constant to prevent the faulty display. Data is input to the gate of a current control transistor which is disposed in series to the driving transistor. Furthermore, light emitting devices using the gate potential fixation method during light emission may comprise a driving transistor with a long channel length. The light emitting device of the invention is classified as the one using the gate potential fixation method in which a driving transistor has a long channel length.

Figure 21:
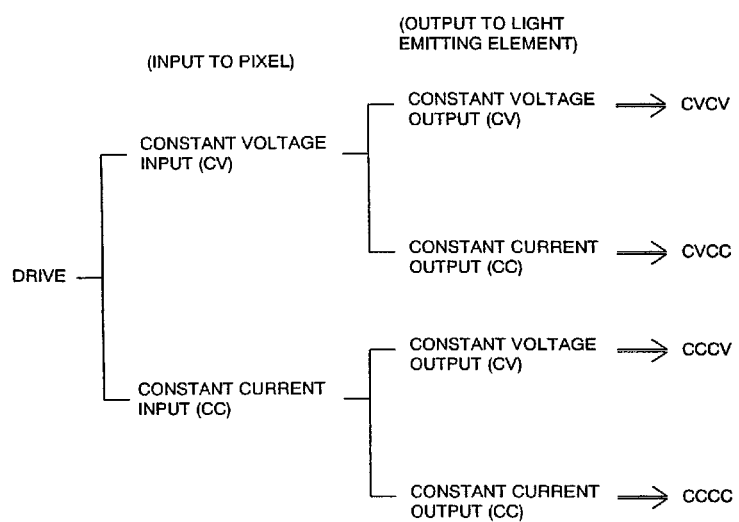
FIG. 21 shows a classification of driving methods of a light emitting device which are classified according to a voltage video signal input or a current video signal input.

FIG. 21 shows a classification of driving methods of a light emitting device of a digital video signal input. They are classified according to a voltage video signal input or a current video signal input. As shown in FIG. 21, with regard to the light emission period of a light emitting element, there is a light emitting device in which a constant voltage (CV) is input to a pixel as a video signal or a constant current (CC) is input to a pixel as a video signal.

The light emitting device using a constant voltage (CV) as a video signal is classified into the one in which a voltage applied to a light emitting element is constant (CVCV) and the one in which a current supplied to a light emitting element is constant (CVCC). Also, the light emitting device using a constant current (CC) as a video signal is classified into the one in which a voltage applied to a light emitting element is constant (CCCV) and the one in which a current supplied to a light emitting element is constant (CCCC).

Embodiment Mode 2

Described in this embodiment mode is another pixel configuration of the light emitting device of the invention which is different from that shown in FIG. 1.

Figure 2:
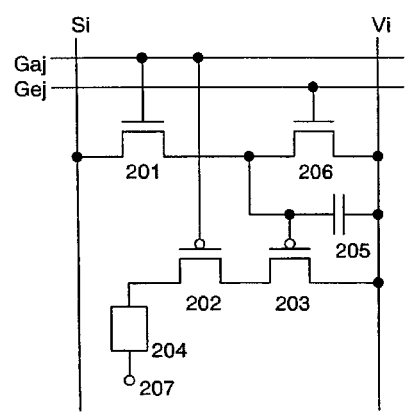
FIG. 2 shows an embodiment mode of the invention.

The pixel shown in FIG. 2 comprises a light emitting element 204, a switching transistor 201, a driving transistor 202, a current controlling transistor 203, and an erasing transistor 206. It is also possible to dispose a capacitor 205 in addition to these elements.

The driving transistor 202 and the current controlling transistor 203 have the same polarity, while the switching transistor 201 and the driving transistor 202 have the opposite polarity to each other. According to the invention, the driving transistor 202 operates in a saturation region while the current controlling transistor 203 operates in a linear region.

The channel length (L) of the driving transistor 202 may be longer than its channel width (W), and L of the current controlling transistor 203 may be equal to or shorter than its W. Desirably, the ratio of L to W (L/W) of the driving transistor 202 is five or more.

The driving transistor 202 may be either an enhancement mode transistor or a depletion mode transistor.

In addition, each of the switching transistor 201 and the erasing transistor 206 may be either an N-channel transistor or a P-channel transistor.

The gate of the switching transistor 201 is connected to a first scan line Gaj (j=1 to y). Either the source or drain of the switching transistor 201 is connected to a signal line Si (i=1 to x), and the other is connected to the gate of the current controlling transistor 203. The gate of the erasing transistor 206 is connected to a second scan line Gej (j=1 to y). Either the source or drain of the erasing transistor 206 is connected to a power supply line Vi (i=1 to x), and the other is connected to the gate of the current controlling transistor 203. The gate of the driving transistor 202 is connected to the first scan line Gaj (i=1 to y). The driving transistor 202 and the current controlling transistor 203 are each connected to the power supply line Vi (i=1 to x) and the light emitting element 204 so that a current supplied from the power supply line Vi (i=1 to x) is supplied to the light emitting element 204 as a drain current of the driving transistor 202 and of the current controlling transistor 203. In this embodiment mode, the source of the current controlling transistor 203 is connected to the power supply line Vi (i=1 to x) and the drain of the driving transistor 202 is connected to a pixel electrode of the light emitting element 204.

It is to be noted that the source of the driving transistor 202 may be connected to the power supply line Vi (i=1 to x), and the drain of the current controlling transistor 203 may be connected to the pixel electrode of the light emitting element 204.

The light emitting element 204 comprises an anode, a cathode, and an electroluminescent layer interposed between the anode and cathode. As shown in FIG. 2, when the anode of the light emitting element 204 is connected to the driving transistor 202, the anode is a pixel electrode and the cathode is a counter electrode 207. The counter electrode 207 is connected to a common power source in all pixels, and a potential difference is given between the power supply line Vi (i=1 to x) and the counter electrode 207 so that a forward bias is applied between anode and cathode of the light emitting element 204.

One of the two electrodes of the capacitor 205 is connected to the power supply line Vi (i=1 to x), and the other is connected to the gate of the current controlling transistor 203. The capacitor 205 is disposed so as to store a potential difference between the two electrodes of the capacitor 205 when the switching transistor 201 is not selected (OFF state). It is to be noted that although FIG. 2 shows the configuration disposing the capacitor 205, the invention is not limited to this and an alternative configuration without the capacitor 205 may be employed as well.

In FIG. 2, each of the driving transistor 202 and the current controlling transistor 203 is a P-channel transistor, and the drain of the driving transistor 202 is connected to the anode of the light emitting element 204. On the contrary, in the case where each of the driving transistor 202 and the current controlling transistor 203 is an N-channel transistor, the source of the driving transistor 202 is connected to the cathode of the light emitting element 204. In this case, the cathode of the light emitting element 204 is a pixel electrode and the anode thereof is a counter electrode.

The driving method of the pixel shown in FIG. 2 is described now. The operation of the pixel shown in FIG. 2 can be divided into a writing period, a data storage period, and an erasing period.

First, in the writing period, the switching transistor 201 whose gate is connected to the first scan line Gaj (j=1 to y) is turned ON by controlling the potential of the first scan line Gaj (j=1 to y). Then, a video signal which is input to the signal line Si (i=1 to x) is input to the gate of the current controlling transistor 203 through the switching transistor 201, thus it is stored in the capacitor 205. At this time, the erasing transistor 206 whose gate is connected to the second scan line Gej (j=1 to y) is OFF; therefore, the driving transistor 202 whose gate is connected to the first scan line Gaj (j=1 to y) is also OFF since the polarity thereof is different from that of the switching transistor 202.

In the data storage period, the switching transistor 201 is turned OFF and the driving transistor 202 is turned ON by controlling the potential of the first scan line Gaj (j=1 to y), thereby storing a potential of the video signal that has been written to the gate of the current controlling transistor 203 in the writing period. It is to be noted that the potential of the second scan line Gej (j=1 to y) remains unchanged from the writing period.

When the current controlling transistor 203 is turned ON by the written video signal, current is supplied to the light emitting element 204 through the current supply line Vi (i=1 to x) since the driving transistor 202 is ON by the potential of the first scan line Gaj (j=1 to y). At this time, the current controlling transistor 203 operates in a linear region, thus a current flowing in the light emitting element 204 is determined by V-I characteristics of the driving transistor 202 operating in a saturation region and the light emitting element 204. The light emitting element 204 emits light at luminance corresponding to the size of the supplied current. On the other hand, when the current controlling transistor 203 is turned OFF by a potential of the written video signal, current is not supplied to the light emitting element 204.

In the erasing period, the erasing transistor 206 is turned ON by controlling the potential of the second scan line Gej (j=1 to y). It is to be noted that the potential of the first scan line Gaj (j=1 to y) remains unchanged from the data storage period. The current controlling transistor 203 is turned OFF since the potential of the power supply line Vi (i=1 to x) is supplied to the gate of the current controlling transistor 203 through the erasing transistor 206. Therefore, the light emitting element 204 during this period is supplied with no current from the power supply line Vi (i=1 to x).

The gate potential of the current controlling transistor 203 is stored; therefore, the erasing transistor 206 may be kept ON constantly during the erasing period or it may be turned ON for a shorter period than the erasing period.

The gate of the driving transistor 202 may be connected to the first scan line in the preceding row or to the first scan line in the subsequent row.

According to the aforementioned configuration, the source-drain voltage Vds of the current controlling transistor 203 is small as it operates in a linear region; therefore, small changes in the gate-source voltage Vgs of the current controlling transistor 203 do not influence the current supplied to the light emitting element 204. Current supplied to the light emitting element 204 is determined by the driving transistor 202 which operates in a saturation region. Therefore, current supplied to the light emitting element 204 is not influenced even without increasing storage capacity of the capacitor 205 which is disposed between the gate and source of the current controlling transistor 203 or suppressing off-current of the switching transistor 201 low. In addition, it is not influenced by the parasitic capacitance of the gate of the current controlling transistor 203 either. Therefore, cause of variation is decreased, and image quality is thus enhanced to a great extent.

It is to be noted that an element substrate of the invention corresponds to the condition before the fabrication of a light emitting element in manufacturing steps of the light emitting device of the invention.

A transistor used in the light emitting device of the invention may be a transistor formed by using single crystalline silicon or an SOI, a thin film transistor using polycrystalline silicon or amorphous silicon, or a transistor using an organic semiconductor or a carbon nanotube. In addition, a transistor disposed in a pixel of the light emitting device of the invention may be a single gate transistor, a double gate transistor, or a multi-gate transistor having more than two gate electrodes.

EMBODIMENTS

Hereinafter described are Embodiments of the invention.

Embodiment 1

Described in this embodiment are a configuration of an active matrix display device to which the pixel configuration of the invention is applied and its drive.

Figure 8:
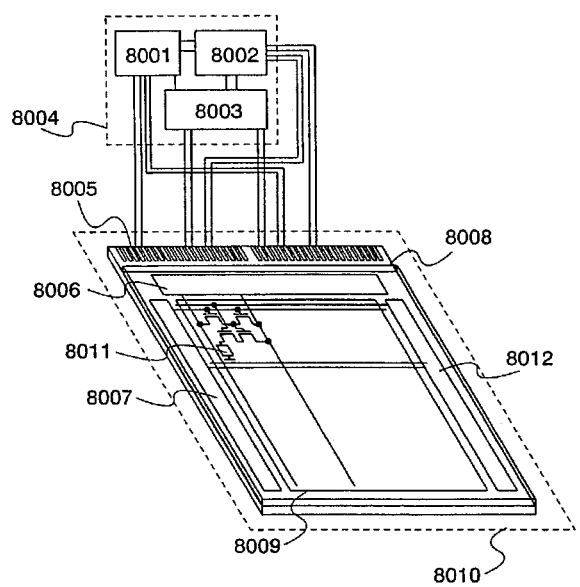
FIG. 8 shows a block diagram showing an external circuit and a schematic view of a panel.

FIG. 8 shows a block diagram of an external circuit and a schematic view of a panel.

An active matrix display device shown in FIG. 8 comprises an external circuit 8004 and a panel 8010. The external circuit 8004 comprises an A/D converter unit 8001, a power supply unit 8002, and a signal generator unit 8003. The A/D converter unit 8001 converts an image data signal which is input as an analog signal into a digital signal (video signal), and supplies it to a signal driver circuit 8006. The power supply unit 8002 generates power having a desired level of voltage from the power supplied from a battery or an outlet, and supplies it to the signal driver circuit 8006, a first scan driver circuit 8007 a second scan driver circuit 8012, a light emitting element 8011, the signal generator unit 8003, and the like. The signal generator unit 8003 is input power, an image signal, a synchronizing signal, and the like. Besides converting each signal, it generates a clock signal and the like for driving the signal driver circuit 8006, the first scan driver circuit 8007, and the second scan driver circuit 8012.

A signal and power from the external circuit 8004 are input to an internal circuit and the like through an FPC and an FPC connection portion 8005 in the panel 8010.

The pixel 8010 comprises a substrate 8008 mounting the FPC connection portion 8005, the internal circuit, and the light emitting element 8011. The internal circuit comprises the signal driver circuit 8006, the first scan driver circuit 8007, the second scan driver circuit 8012, and a pixel portion 8009. The pixel portion 8009 may employ any pixel configurations set forth in Embodiment Modes of the invention.

The pixel portion 8009 is disposed in the center of the substrate, and the signal driver circuit 8006, the first scan driver circuit 8007, and the second scan driver circuit 8012 are disposed on the periphery of the pixel portion 8009. The light emitting element 8011 and a counter electrode of the light emitting element are formed over the entire pixel portion 8009.

Figure 4:
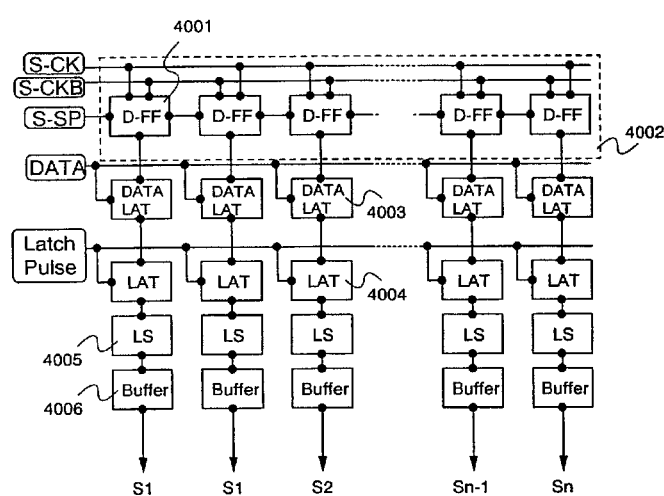
FIG. 4 shows a configuration example of a signal driver circuit.
Figure 9:
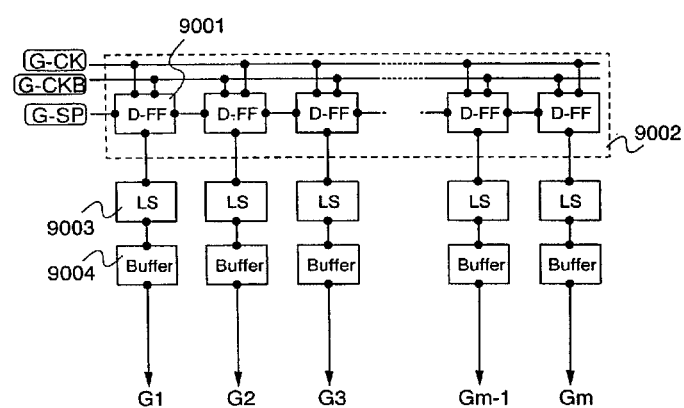
FIG. 9 is a configuration example of a scan driver circuit.

With reference to FIGS. 9 and 4, the operation of FIG. 8 is described now. FIG. 9 shows a block diagram of the first scan driver circuit 8007 or the second scan driver circuit 8012, and FIG. 4 shows a block diagram of the signal driver circuit 8006.

Each of the first scan driver circuit 8007 and the second scan driver circuit 8012 comprises a shift register 9002 including a plurality of stages of D-flip flops 9001, a level shifter 9003, a buffer 9004, and the like.

It is assumed that a clock signal (G-CK), an inverted clock signal (G-CKB), and a start pulse (G-SP) are input. It is to be noted that although the configuration of the second scan driver circuit 8012 is the same as that of the first scan driver circuit 8007, the timing and the pulse width of the start pulse (G-SP) are difference from each other.

The signal driver circuit 8006 comprises a shift register 4002 including a plurality of stages of D-flip flops 4001, a data latch circuit 4003, a latch circuit 4004, a level shifter 4005, a buffer 4006, and the like.

It is assumed that a clock signal (S-CK), an inverted clock signal (S-CKB), a start pulse (S-SP), a video signal (DATA), and a latch pulse (LatchPulse) are input.

First, in accordance with the timing at which a clock signal, an inverted clock signal, and a start pulse are input, the shift register 9002 in the first scan driver circuit 8007 sequentially outputs a sampling pulse, thus scan lines G1 to Gm are sequentially selected.

Then, in accordance with the timing at which a clock signal, an inverted clock signal, and a start pulse are input, the shift register 4002 sequentially outputs a sampling pulse to the data latch circuit 4003. In accordance with the timing at which the sampling pulse is input to the data latch circuit 4003, a video signal is sampled and thus stored. These operations are sequentially performed from the first column.

When the storage of a video signal is completed in the data latch circuit 4003 on the last stage, a latch pulse is input during a horizontal retrace period, and the video signal stored in the data latch circuit 4003 is transferred to the latch circuit 4004 all at once. Then, it is level-shifted in the level shifter 4005, and adjusted in the buffer 4006 so as to be output to signal lines S1 to Sn all at once. At this time, an H-level or an L-level signal is input to pixels in the first scan line selected by the scan driver circuit 8007, thereby controlling a light emission or non-emission of the light emitting element 8011.

At this time, during the light emission period of the light emitting element 8011, a potential which can turn ON the driving transistor is output to each second scan line from the second scan driver circuit 8012. Then, when the desired light emission period is complete and thus proceeds to the non-light emission period, a potential which can turn OFF the driving transistor is output.

Although the active matrix display device shown in this embodiment comprises the panel 8010 and the external circuit 8004 each formed independently, they may be integrally formed on the same substrate. Also, although the display device employs an OLED in this embodiment as an example, alternative light emitting elements can be employed as well. In addition, the level shifter 4005 and the buffer 4006 may not necessarily be provided in the signal driver circuit 8006, and the level shifter 9003 and the buffer 9004 may not necessarily be provided in the first scan driver circuit 8007 and the second scan driver circuit 8012.

Embodiment 2

Figure 3:
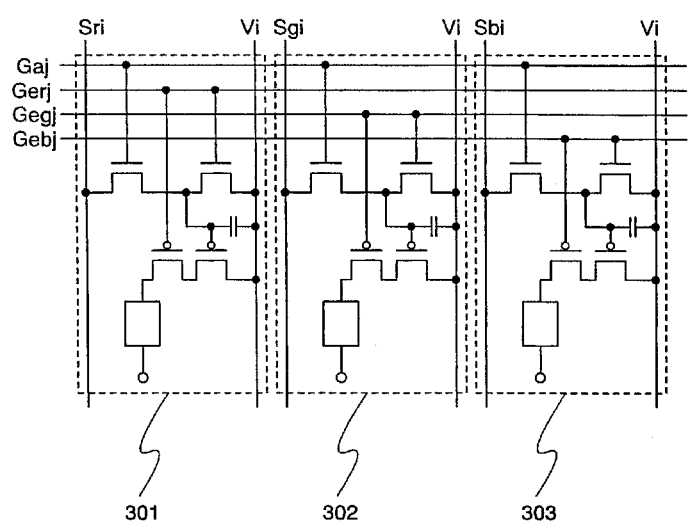
FIG. 3 shows a configuration example of a pixel of the invention.
Figure 10:
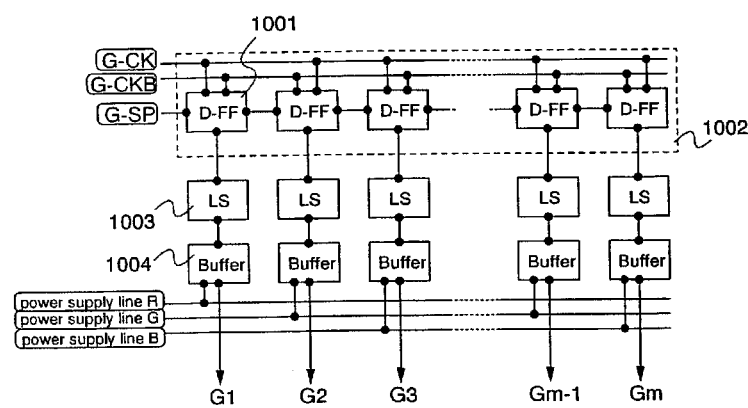
FIG. 10 is a configuration example of a scan driver circuit.

Described in this embodiment is an example of a second scan driver circuit in which a white balance is controlled by applying a different voltage to the gate electrode of the driving transistor in each pixel of Red, Green and Blue which is described in embodiment modes. FIG. 10 shows a block diagram of a scan driver circuit of this embodiment, and FIG. 3 shows pixels of this embodiment mode.

The second scan driver circuit 8012 comprises a shift register 1002 including a plurality of stages of D-flip flops 1001, a level shifter 1003, a buffer 1004, and the like.

It is assumed that a clock signal (G-CK), an inverted clock signal (G-CKB), and a start pulse (G-SP), are input.

The buffer 1004 which is connected to each scan line Gerj (j=1 to y), Gegj (j=1 to y), or Gebj (j=1 to y) is connected to a different power supply line. Specifically, a buffer which is connected to the scan line Gerj is connected to a power supply line R, a buffer which is connected to the scan line Gegj is connected to a power supply line G, and a buffer which is connected to the scan line Gebj is connected to a power supply line B. When the buffer 1004 is not provided, it is possible to connect a level shifter 1003 which is connected to each scan line Gerj (j=1 to y), Gegj (j=1 to y), or Gebj (j=1 to y) to the different power supply line.

In order to erase a red pixel 301, the scan line Gerj is used, and to erase a green pixel 302, the scan line Gegj is used. Also, to erase the blue pixel 303, the scan line Gebj is used.

Embodiment 3

Figure 5:
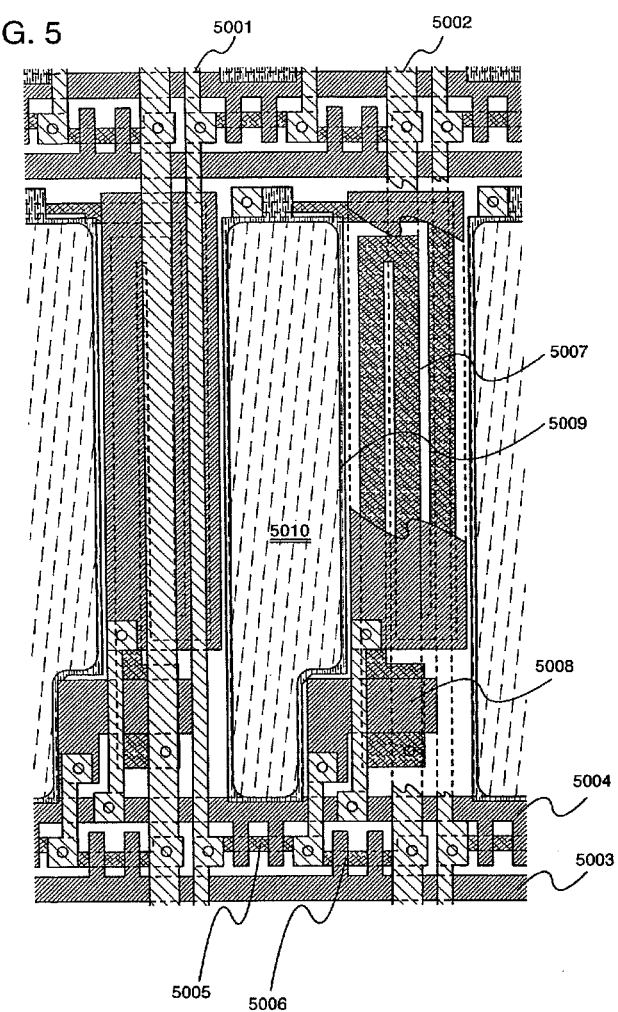
FIG. 5 shows a top plan view of the invention.

Described in this embodiment is a top plan view of the pixel shown in FIG. 1. FIG. 5 shows a top plan view of a pixel of this embodiment.

Reference numeral 5001 denotes a signal line, 5002 denotes a power supply line, 5004 denotes a first scan line, and 5003 denotes a second scan line. In this embodiment, the signal line 5001 and the power supply line 5002 are formed of the same conductive film, and the first scan line 5004 and the second scan line 5003 are formed of the same conductive film. Reference numeral 5005 denotes a switching transistor, and a part of the first scan line 5004 functions as its gate electrode. Reference numeral 5007 denotes a driving transistor, and a part of the second scan line 5003 functions as its gate electrode. Reference numeral 5008 denotes a current controlling transistor. An active layer of the driving transistor 5007 is curved so that its L/W becomes larger than that of the current controlling transistor 5008. Reference numeral 5009 denotes a pixel electrode, and light is emitted in its overlapped area 5010 (light emitting area) with an electroluminescent layer and a cathode (neither of them is shown).

It is to be noted that the top plan view of the invention shown in this embodiment is only an example, and the invention is, needless to say, not limited to this.

Embodiment 4

Described in this embodiment is a cross-sectional structure of a pixel in the case where each of a driving transistor and a current controlling transistor is a P-channel transistor.

Figure 12A:
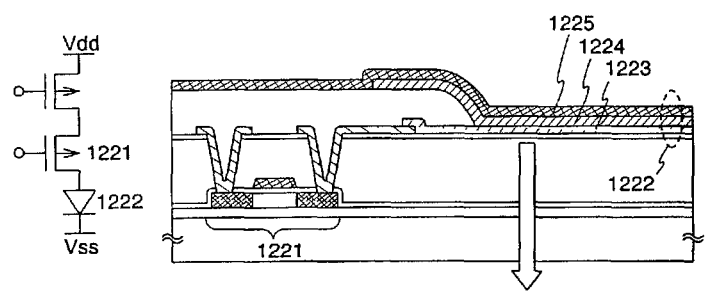
FIGS. 12A and 12B show examples of a cross-sectional structure of the invention.

FIG. 12A shows a cross-sectional view of a pixel in which a driving transistor 1221 is a P-channel transistor and light emitted from a light emitting element 1222 is transmitted to an anode 1223 side. In FIG. 12A, the anode 1223 of the light emitting element 1222 is electrically connected to the driving transistor 1221, and an electroluminescent layer 1224 and a cathode 1225 are laminated on the anode 1223 in this order. As for the cathode 1225, known material can be used as long as it is a conductive film having a small work function and reflecting light. For example, Ca, Al, CaF, MgAg, AlLi, and the like are desirably used. The electroluminescent layer 1224 may comprise a single layer or multiple layers. When it comprises multiple layers, a hole injection layer, a hole transporting layer, a light emitting layer, an electron transporting layer, and an electron injection layer are sequentially laminated in this order on the anode 1223. It is to be noted that not all of the above layers are necessarily provided. The anode 1223 may be formed of a transparent conductive film which transmits light, such as the one comprising ITO or the one in which indium oxide is mixed with zinc oxide (ZnO) of 2 to 20%.

The overlapped portion of the anode 1223, the electroluminescent layer 1224, and the cathode 1225 corresponds to the light emitting element 1222. In the case of the pixel shown in FIG. 12A, light emitted from the light emitting element 1222 is transmitted to the anode 1223 side as shown by an outline arrow.

Figure 12B:
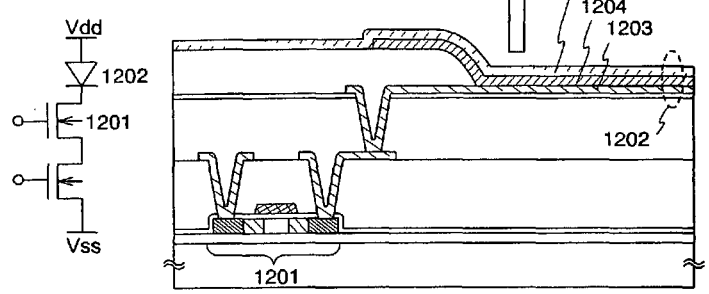

FIG. 12B shows a cross-sectional view of a pixel in which a driving transistor 1201 is an N-channel transistor and light emitted from a light emitting element 1202 is transmitted to an anode 1205 side. In FIG. 12B, a cathode 1203 of the light emitting element 1202 is electrically connected to the driving transistor 1201, and an electroluminescent layer 1204 and an anode 1205 are laminated on the cathode 1203 in this order. As for the cathode 1203, known material can be used as long as it is a conductive film having a small work function and reflecting light. For example, Ca, Al, CaF, MgAg, AlLi, and the like are desirably used. The electroluminescent layer 1204 may comprise a single layer or multiple layers. When it comprises multiple layers, an electron injection layer, an electron transporting layer, a light emitting layer, a hole transporting layer, and a hole injection layer and are sequentially laminated in this order on the cathode 1203. It is to be noted that not all the above layers are necessarily provided. The anode 1205 may be formed of a transparent conductive film which transmits light, such as the one comprising ITO or the one in which indium oxide is mixed with zinc oxide (ZnO) of 2 to 20%.

The overlapped portion of the anode 1205, the electroluminescent layer 1204, and the cathode 1205 corresponds to the light emitting element 1202. In the case of the pixel shown in FIG. 12B, light emitted from the light emitting element 1202 is transmitted to the anode 1205 side as shown by an outline arrow.

It is to be noted that although shown in this embodiment is the one in which a driving transistor is electrically connected to a light emitting element, a current controlling transistor may be interposed between the driving transistor and the light emitting element.

Embodiment 5

Described in this embodiment is an example of the drive timing using the pixel configuration of the invention.

Figure 11A:
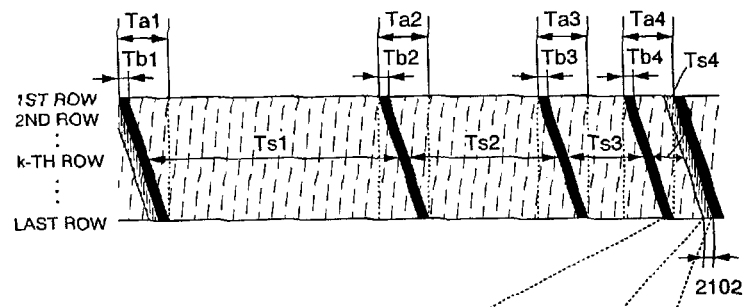
FIGS. 11A and 11B show examples of the operation timing of the invention.

FIG. 11A shows an example using a digital time gray scale method for a 4-bit gray scale display. In data storage periods Ts1 to Ts4, the ratio of the time length is Ts1:Ts2:Ts3:Ts4=$2^3$:$2^2$:$2^1$:$2^0$=8:4:2:1.

The operation is described now. First, in a writing period Th1, the first scan line is selected from the first row in sequence, thereby turning ON the switching transistors. Next, a video signal is input to each pixel from a signal line, thereby controlling a light emission or non-emission of each pixel according to a potential of the signal. Once the video signal is written, that row proceeds to the data storage period Ts1 immediately. The same operations are performed up to the last row, and thus a period Ta1 terminates. Subsequently, a writing period Tb2 is started in sequence from the row in which the data storage period Ts1 is complete.

In the sub-frame period (corresponds to a period Ta4 here) having the shorter data storage period than the writing period, an erasing period 2102 is provided so that a next writing period is not started immediately after the data storage period. In the erasing period, a light emitting element is forced to be in a non-light emission state.

Taken as an example here is the case of expressing a 4-bit gray scale display; however the numbers of bits and gray scale levels are not limited to this. In addition, light emission is not necessarily performed from Ts1 to Ts4 in sequence. It may be performed at random, or divided into a plurality of periods.

Figure 11B:
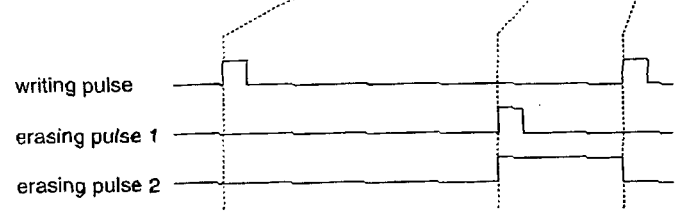

FIG. 11B shows an example of a writing pulse and an erasing pulse. In the case of inputting the erasing pulse, it may be input row by row as shown by an erasing pulse 1 while storing it by a capacitor and the like during an erasing period, or H level pulses may be input constantly during an erasing period as shown by an erasing pulse 2. It is to be noted that all the pulses shown in FIG. 11B are applied to the case where each of the switching transistor and the erasing transistor is an N-channel transistor. When each of them is a P-channel transistor, these pulses are all inversed.

Embodiment 6

The display device of the invention can be used in display portions of various electronic apparatuses. In particular, the display device of the invention is desirably applied to a mobile device that preferably consumes less power.

Electronic apparatuses using the display device of the invention include a portable information terminal (a cellular phone, a mobile computer, a portable game machine, an electronic book, and the like), a video camera, a digital camera, a goggle display, a display device, a navigation system, and the like. Specific examples of these electronic apparatuses are shown in FIGS. 6A to 6D.

Figure 6A:
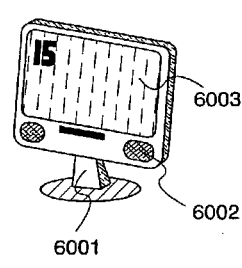
FIGS. 6A to 6D show views of electronic apparatuses to which the invention can be applied.

FIG. 6A illustrates a display device which includes a housing 6001, an audio output portion 6002, a display portion 6003, and the like. The display device of the invention can be applied to the display portion 6003. Note that the display device includes all the information display devices for personal computers, television broadcast reception, advertisement, and the like.

Figure 6B:
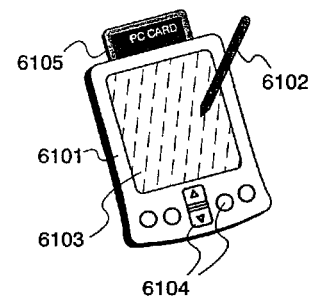

FIG. 6B illustrates a mobile computer which includes a main body 6101, a stylus 6102, a display portion 6103, operation keys 6104, an external interface 6105, and the like. The display device of the invention can be applied to the display portion 6103.

Figure 6C:
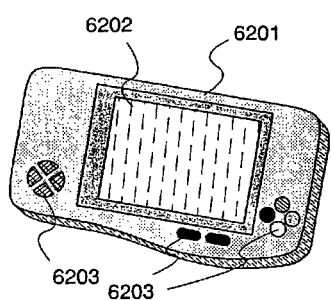

FIG. 6C illustrates a game machine which includes a main body 6201, a display portion 6202, operation keys 6203, and the like. The display device of the invention can be applied to the display portion 6202.

Figure 6D:
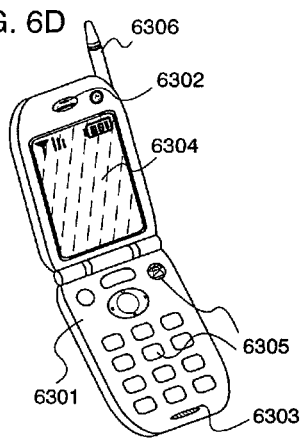
Figure 7:
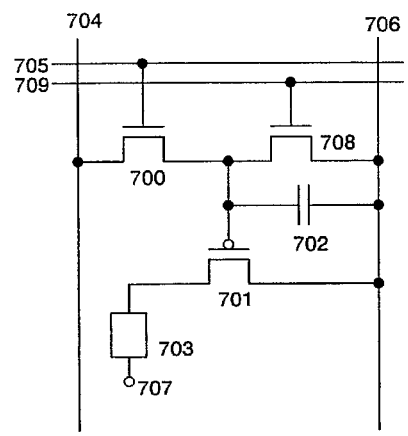
FIG. 7 shows a conventional configuration.

FIG. 6D illustrates a cellular phone which includes a main body 6301, an audio output portion 6302, a display portion 6304, operation switches 6305, an antenna 6306, and the like. The display device of the invention can be applied to the display portion 6304.

As described above, an application range of the invention is so wide that the invention can be applied to electronic apparatuses in various fields.

Embodiment 7

Figure 13:
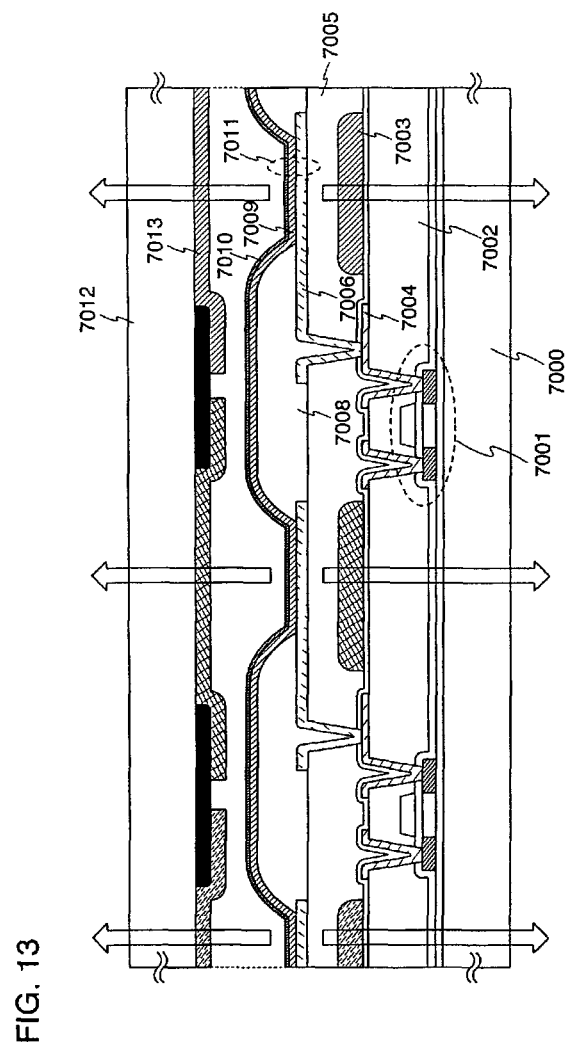
FIG. 13 shows an example of a cross-sectional structure of the invention.

With reference to FIG. 13, a cross-sectional structure of a pixel in the light emitting device according to the invention is described now. FIG. 13 shows a driving transistor 7001 formed on a substrate 7000. The driving transistor 7001 is covered with a first interlayer insulating film 7002. On the first interlayer insulating film 7002, a color filter 7003 formed of a resin and the like, a wiring 7004 which is electrically connected to a drain of the driving transistor 7001 through a contact hole are formed. It is also possible to form a current controlling transistor between the driving transistor 7001 and the wiring 7004.

A second interlayer insulating film 7005 is formed on the first interlayer insulating film 7002 so as to cover the color filter 7003 and the wiring 7004. Each of the first interlayer insulating film 7002 and the second interlayer insulating film 7005 may be formed by depositing silicon oxide, silicon nitride, or silicon oxynitride in a single layer or laminated layers by plasma CVD or spattering. It is also possible to laminate a silicon oxynitride film in which a mole fraction of oxygen is higher than that of nitrogen over a silicon oxynitride film in which a mole fraction of nitrogen is higher than that of oxygen to be used as the first interlayer insulating film 7002 or the second interlayer film 7005. Alternatively, an organic resin film may be used as the first interlayer film 7002 or the second interlayer film 7005.

On the second interlayer insulating film 7005, a wiring 7006 which is electrically connected to the wiring 7004 through a contact hole is formed. A part of the wiring 7006 functions as an anode of a light emitting element. The wiring 7006 is formed so as to overlap with the color filter 7003 with the second interlayer insulating film 7005 interposed therebetween.

In addition, an organic resin film 7008 is formed on the second interlayer insulating film 7005 so as to function as a bank. The organic resin film 7008 has an opening, in which a light emitting element 7011 is formed by overlapping the wiring 7006 which functions as an anode, an electroluminescent layer 7009, and a cathode 7010 with each other. The electroluminescent layer 7009 has a single light emitting layer or multiple layers including a light emitting layer. It is also possible to form a protective film on the organic resin film 7008 and the cathode 7010. In this case, as a protective film, a film that allows substances that may cause the deterioration of the light emitting element such as moisture and oxygen to penetrate with difficulty in comparison with other insulating films transmitting is used. Typically, a DLC film, a carbon nitride film, a silicon nitride film formed by RF sputtering, or the like can be preferably used. Also, it is also possible to form a protective film by laminating the aforementioned film that allows substances such as moisture and oxygen to penetrate with difficulty and a film that allows substances such as moisture and oxygen to penetrate easier in comparison with the former film transmitting.

Before the electroluminescent layer 7009 is formed, the organic resin film 7008 is heated in a vacuum atmosphere in order to remove absorbed moisture, oxygen, and the like.

Specifically, heat treatment is applied in a vacuum atmosphere at a temperature of 100 to 200° C. for about 0.5 to 1 hour. The vacuum is desirably set at $3 \times 10^{-7}$ Torr or less, and, if possible, most desirably at $3 \times 10^{-8}$ Torr or less. In the case of depositing an electroluminescent layer after applying heat treatment onto the organic resin film 7008 in the vacuum atmosphere, the reliability can be further enhanced by maintaining the electroluminescent layer in the vacuum atmosphere until immediately before the deposition.

As for an end portion in the opening of the organic resin film 7008, it is desirable to be formed roundish so that the electroluminescent layer 7009 to be formed later which partially overlaps with the organic resin film 7008 will have no holes in the end. Specifically, a curvature radius of the curved line shown by the sectional surface of the organic resin film 7008 in the opening is desirably in the range of 0.2 to 2 μm.

According to the aforementioned structure, the coverage of an electroluminescent layer and a cathode that are formed later can be enhanced. Thus, it can be prevented that the wiring 7006 and the cathode 7010 are short-circuited in the holes that are formed in the electroluminescent layer 7009. Moreover, by alleviating the stress of the electroluminescent layer 7009, a defect called shrink, in which a light emitting region decreases, can be reduced and the reliability is thus enhanced.

In the example shown in FIG. 13, a positive photosensitive acrylic resin is used as the organic resin film 7008. Photosensitive organic resin is classified into a positive type in which a portion of a resin film that is exposed to an energy beam such as photon, electron, and ion is removed, and a negative type in which the exposed portion remains whereas the rest is removed. In the invention, a negative organic resin film may also be used. In addition, the organic resin film 7008 may also be formed by using photosensitive polyimide. When the organic resin film 7008 is formed by using negative photosensitive acrylic, an end portion in the opening of the organic resin film 7008 takes on an S-shaped cross section. It is desirable that curvature radius of the curved line of an upper end portion and a lower end portion of the opening be from 0.2 to 2 μm.

For the wiring 7006, a transparent conductive film provided by mixing 2 to 20% of zinc oxide (ZnO) with indium oxide may be used as well as ITO. FIG. 13 employs ITO as the wiring 7006. The wiring 7006 may be wiped and polished by CMP and by using a PVA (polyvinyl alcohol) porous body to level off the surface. Also, after polishing the surface of the wiring 7006 by CMP, it may be subjected to ultraviolet irradiation, oxygen plasma treatment, or the like.

The cathode 7010 is formed to have a thickness that transmits light. Any known materials can be used for the cathode 7010 as long as being a conductive film having a low work function. For example, Ca, Al, CaF, MgAg, AlLi and the like are preferably used. In order to obtain light emitted from the cathode side, a method in which ITO having smaller work function by means of Li doping may be employed as well as the method to reduce the film thickness. The light emitting element according to the invention may have a structure in which light is emitted from both anode and cathode sides.

Practically, when the device has been completed up to the stage shown in FIG. 13, a transparent covering material 7012 or a protective film (a laminate film, an ultraviolet curing resin film, or the like) having good airtightness and less degasification is desirably used to package (seal) the device without exposing it to the air. At that time, the reliability of the light emitting element is enhanced by filling the inside of the covering material with an inert atmosphere or providing a moisture absorption material (e.g., barium oxide). According to the invention, the covering material 7012 may include a color filter 7013.

It is to be noted that the invention is not limited to the manufacturing method as described above, and alternative known methods can be used as well.

Embodiment 8

Described in this embodiment mode is a pixel configuration of the pixel shown in FIG. 1, in which the positions of the driving transistor 102 and the current controlling transistor 103 are switched.

Figure 14:
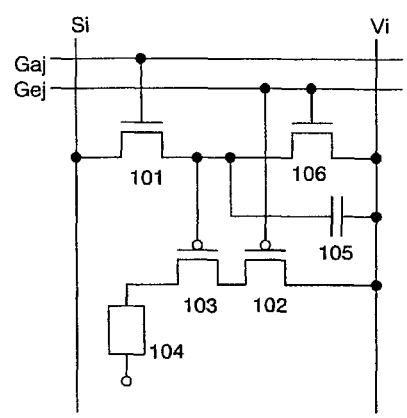
FIG. 14 shows an embodiment of the invention.

FIG. 14 shows a circuit diagram of the pixel of this embodiment. It is to be noted that the elements and wirings which are already shown in FIG. 1 are denoted by the same reference numerals in FIG. 14. The pixel shown in FIG. 14 is similar to the pixel shown in FIG. 1 in that current which is supplied from the first power supply line Vi (i=1 to x) is supplied to the light emitting element 104 as a drain current of the driving transistor 102 and of the current controlling transistor 103. However, it is different in that the source of the driving transistor 102 is connected to the first power supply line Vi (i=1 to x) and the drain of the current controlling transistor 103 is connected to the pixel electrode of the light emitting element 104.

In this embodiment, the source of the driving transistor 102 is connected to the first power supply line Vi, thus the gate-source voltage Vgs of the driving transistor 102 is fixed. That means, the gate-source voltage Vgs of the driving transistor 102 which operates in a saturation region does not vary and remain fixed even when the light emitting element 104 deteriorates. Therefore, although normal transistors have larger variations in drain current in a saturation region than in a linear region due to the variations in the gate-source voltage Vgs, the drain current can be prevented from varying as for the driving transistor 102 which operates in a saturation region, even when the light emitting element 104 deteriorates according to the present embodiment.

On the other hand, when the source of the current controlling transistor 103 is connected to the first power supply line Vi and the drain of the driving transistor 102 is connected to the pixel electrode of the light emitting element 104, the gate-source voltage Vgs of the current controlling transistor 103 is determined by the potential of the first power supply line Vi and the potential of a video signal, thus it is not influenced by the drain-source voltage Vds of the driving transistor 102 is not influenced. The driving transistor 102 which operates in a saturation region has a larger source-drain voltage Vds as compared to the current controlling transistor 103 which operates in a linear region. However, as shown in FIG. 1, when employing a pixel in which the gate-source voltage Vgs of the current controlling transistor 103 is not influenced by the drain-source voltage Vds of the driving transistor 102, the current controlling transistor 103 can be driven with a few potential difference between the potential of the first power supply line Vi and the potential of the video signal, which contributes to the reduction in power consumption.

Embodiment 9

Figure 15:
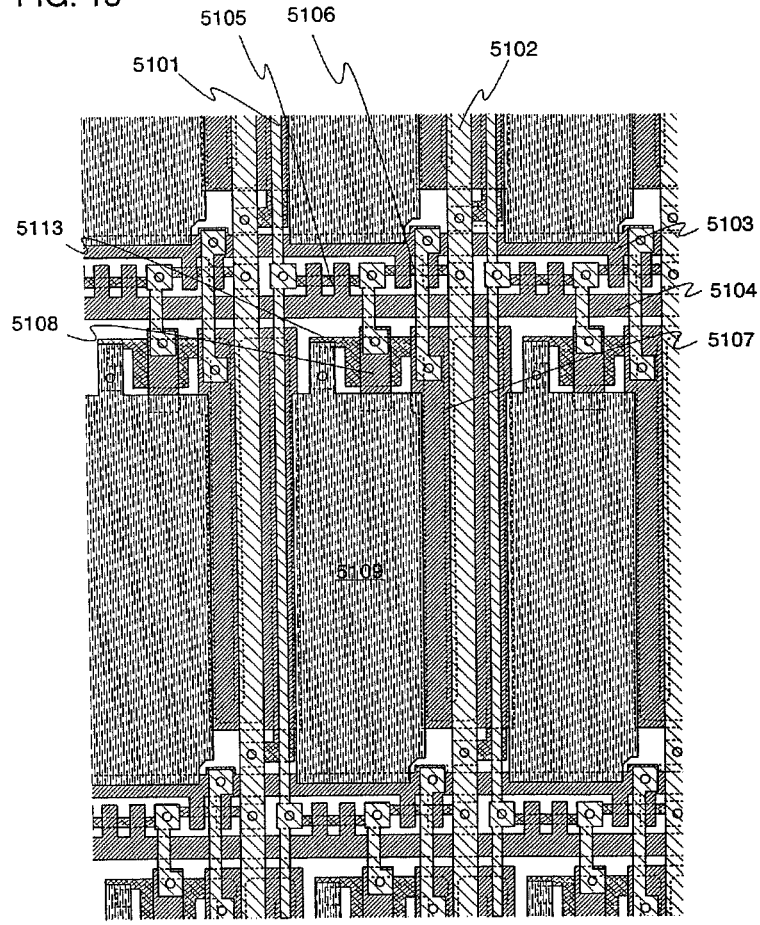
FIG. 15 shows an example of a top plan view of the invention.

Described in this embodiment is a top plan view of the pixel shown in FIG. 14. Shown here is an example based on the pixel shown in FIG. 14, in which a resistor is disposed between the pixel electrode of the light emitting element 104 and the drain of the current controlling transistor 103. FIG. 15 shows a top plan view of the pixel of this embodiment.

Reference numeral 5101 denotes a signal line, 5102 denotes a power supply line, 5104 denotes a first scan line, and 5103 denotes a second scan line. In this embodiment, the signal line 5101 and the power supply line 5102 are formed of the same conductive film, and the first scan line 5104 and the second scan line 5103 are formed of the same conductive film. Reference numeral 5105 denotes a switching transistor, and a part of the first scan line 5104 functions as its gate electrode. Reference numeral 5106 denotes an erasing transistor, and a part of the second scan line 5103 functions as its gate electrode. Reference numeral 5107 denotes a driving transistor, and 5108 denotes a current controlling transistor. Reference numeral 5113 denotes a resistor formed of a semiconductor film. An active layer of the driving transistor 5107 is curved so that its L/W becomes larger than that of the current controlling transistor 5108. Reference numeral 5109 denotes a pixel electrode, and light is emitted in its overlapped area (light emitting area) with an electroluminescent layer and a cathode (neither of them is shown).

By providing the resistor 5113, it can be prevented that, after depositing a conductive film to be used as the pixel electrode 5109 of a light emitting element and before patterning it to complete the pixel electrode 5109, the drain potential of the driving transistor 5107 changes abruptly due to the charge accumulated in the conductive film, which will destroy the driving transistor 5107.

It is to be noted that the top plan view of the invention shown in this embodiment is only an example, and the invention is, needless to say, not limited to this.

Embodiment 10

Described in this embodiment is a pixel configuration of the pixels shown in FIGS. 1 and 3 in the case where a resistor is disposed between the light emitting element and the drain of the driving transistor 102.

Figure 16A:
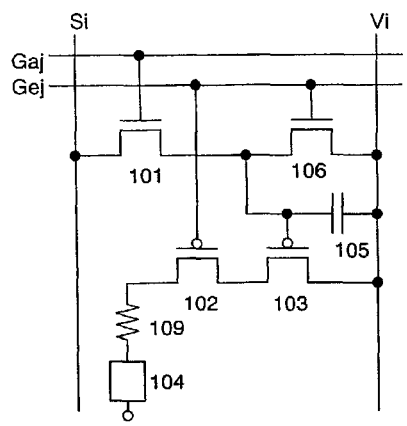
FIGS. 16A and 16B each show an embodiment mode of the invention.

FIG. 16A shows a pixel configuration of FIG. 1 disposing a resistor additionally. It is to be noted that the elements and wirings which are already shown in FIG. 1 are denoted by the same reference numerals in FIG. 16A. The pixel shown in FIG. 16A is different from FIG. 1 in that a resistor 109 is disposed between the pixel electrode of the light emitting element 104 and the drain of the driving transistor 102.

Figure 16B:
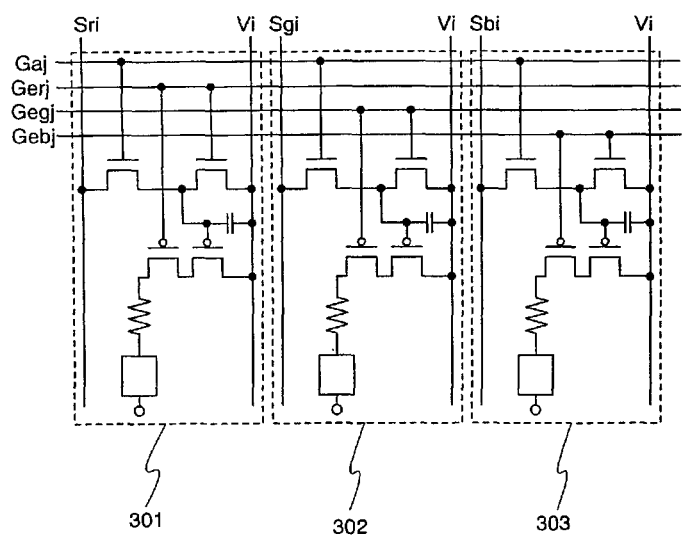

FIG. 16B shows a pixel configuration in which a white balance is controlled by applying a different voltage to the gate electrode of the driving transistor 102 in each pixel of Red, Green, and Blue. In FIG. 16B, in the red pixel 301, a second power supply line Wrj for red color (R) is connected to the gate of the driving transistor 102. In the green pixel 302, a second power supply line Wgj for green color (G) is connected to the gate of the driving transistor 102. In the blue pixel 303, a second power supply line Wbj for blue color (B) is connected to the gate of the driving transistor 102.

By providing the resistor 109, it can be prevented that, after depositing a conductive film to be used as the pixel electrode of the light emitting element 104 and before patterning it to complete the pixel electrode, the drain potential of the driving transistor 102 changes abruptly due to the charge accumulated in the conductive film, which will destroy the driving transistor 102.

According to the light emitting device of the invention, an interlayer film, for example, having a diagonal size of 4 to 4.3 inches which is to be used as a bank for separating adjacent light emitting elements may be formed to have a width of 20 μm and the pixel size with a VGA (640×480) 200 dpi may be set at 45×135 μm.

Embodiment 11

Figure 17A:
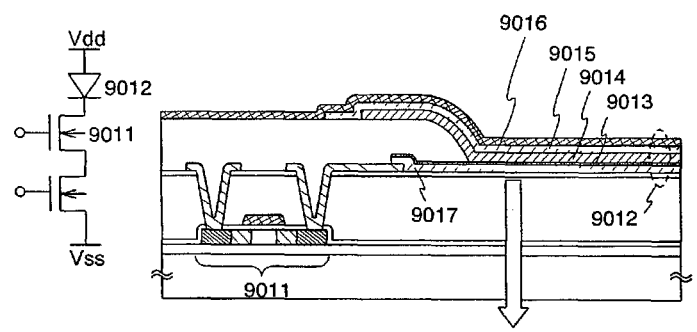
FIGS. 17A and 17B each show an embodiment of a cross-sectional structure of the invention.

FIG. 17A shows a cross-sectional view of a pixel in which a driving transistor 9011 is an N-channel transistor and light emitted from a light emitting element 9012 is transmitted to a cathode 9013 side. In FIG. 17A, the cathode 9013 of the light emitting element 9012 is formed on a transparent conductive film 9017 which is electrically connected to a drain of the driving transistor 9011, and an electroluminescent layer 9014 and an anode 9015 are laminated on the cathode 9013 in this order. A shielding film 9016 which reflects or shuts off light is formed so as to cover the anode 9015. As for the cathode 9013, known material can be used as long as it is a conductive film having a small work function and reflecting light. For example, Ca, Al, CaF, MgAg, AlLi, and the like are desirably used. The film is formed to have a thickness that transmits light. For example, Al having a thickness of 20 nm can be used for the cathode 9013. The electroluminescent layer 9014 may comprise a single layer or multiple layers. The cathode 9015 may be formed of a transparent conductive film such as the one comprising ITO, ITSO, or the one in which indium oxide is mixed with zinc oxide (ZnO) of 2 to 20% although it does not necessarily transmit light. Alternatively, Ti or TiN may be used as well. For the shielding film 9016, a light-reflective metal can be used for example; however, the invention is not limited to a metal film. For example, a resin doped with black pigment and the like can be used.

The overlapped portion of the cathode 9013, the electroluminescent layer 9014, and the anode 9015 corresponds to the light emitting element 9012. In the case of the pixel shown in FIG. 17A, light emitted from the light emitting element 9012 is transmitted to the cathode 9013 side as shown by an outline arrow.

Figure 17B:
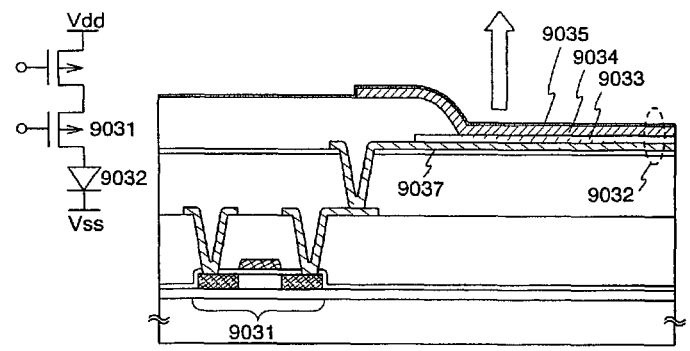

FIG. 17B shows a cross-sectional view of a pixel in which a driving transistor 9031 is a P-channel transistor and light emitted from a light emitting element 9032 is transmitted to a cathode 9035 side. In FIG. 17B, an anode 9033 of the light emitting element 9032, an electroluminescent layer 9034, and the cathode 9035 are laminated in this order on a wiring 9037 which is electrically connected to a drain of the driving transistor 9031. According to the aforementioned configuration, light is reflected in the wiring 9037 even if the light is transmitted through the anode 9033. As for the cathode 9035, known material can be used as long as it is a conductive film having a small work function and reflecting light as in FIG. 17A. However, the film is formed to have a thickness which transmits light. For example, Al having a thickness of 20 nm can be used for the cathode 9035. The electroluminescent layer 9034 may comprise a single layer or multiple layers as in FIG. 17A. Although the cathode 9033 is not required to transmit light, it can be formed by using a transparent conductive film as in FIG. 17A, or TiN or Ti can be used as well.

The overlapped portion of the anode 9033, the electroluminescent layer 9034, and the cathode 9035 corresponds to the light emitting element 9032. In the case of the pixel shown in FIG. 17B, light emitted from the light emitting element 9032 is transmitted to the cathode 9035 side as shown by an outline arrow.

It is to be noted that although shown in this embodiment is the one in which the driving transistor is electrically connected to the light emitting element, a current controlling transistor may be interposed between the driving transistor and the light emitting element.

Embodiment 12

Described in this embodiment is a cross-sectional view of a pixel structure in the case where each of a driving transistor and a current controlling transistor is a bottom-gate transistor.

Transistors used in the invention may be formed of amorphous silicon. When forming a transistor by using amorphous silicon, a manufacturing method can be simplified as there is no need to provide a crystallization process which contributes to the cost reduction. However, as for the transistor formed of amorphous silicon, a P-channel transistor is more suitable for a pixel of a light emitting device than an N-channel transistor as it has higher mobility. In this embodiment, a cross-sectional structure of a pixel in the case of using an N-channel driving transistor is described.

Figure 18:
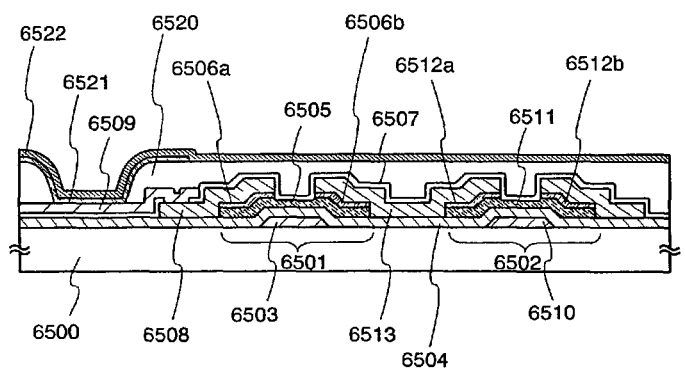
FIG. 18 shows an embodiment of a cross-sectional structure of the invention.

FIG. 18A shows a cross-sectional view of a pixel of this embodiment. Reference numeral 6501 denotes a driving transistor and 6502 denotes a current driving transistor. The driving transistor 6501 comprises a gate electrode 6503 formed on a substrate 6500 having an insulating surface, a gate insulating film 6504 formed on the substrate 6500 so as to cover the gate electrode 6503, and a semiconductor film 6505 overlapped with the gate electrode 6503 with the gate insulating film 6504 interposed therebetween. The semiconductor film 6505 comprises two impurity regions 6506a and 6506b each functioning as a source or a drain and doped with an impurity that imparts conductivity. In addition, the impurity region 6506a is connected to the wiring 6506.

The current controlling transistor 6502 comprises, as well as the driving transistor 6501, a gate electrode 6510 formed on the substrate 6500 having an insulating surface, the gate insulating film 6504 formed on the substrate 6500 so as to cover the gate electrode 6510, and a semiconductor film 6511 overlapped with the gate electrode 6510 with the gate insulating film 6504 interposed therebetween. The semiconductor film 6511 comprises two impurity regions 6512a and 6512b each functioning as a source or a drain and doped with an impurity that imparts conductivity. In addition, the impurity region 6512a is connected to the impurity region 6506b of the driving transistor 6501 through the wiring 6513.

Each of the driving transistor 6501 and the current controlling transistor 6502 is covered with a protective film 6507 formed of an insulating film. Through a contact hole formed in the protective film 6507, a wiring 6508 is connected to an anode 6509. Each of the driving transistor 6501, the current controlling transistor 6502, and the protective film 6507 is covered with an interlayer insulating film 6520. The interlayer insulating film 6520 has an opening in which the anode 6509 is exposed. On the anode 6509, an electrouminescent layer 6521 and a cathode 6522 are formed.

Although described with reference to FIG. 18A is the case where each of the transistor and the current controlling transistor is an N-channel transistor, P-channel transistors may be employed as well. In that case, an impurity imparting P-type conductivity is employed for controlling the threshold voltage of the driving transistor.

Current supplied to a light emitting element is not influenced even without increasing storage capacity of a capacitor which is disposed between the gate and source of a current controlling transistor or suppressing off-current of a switching transistor low. In addition, it is not influenced by the parasitic capacitance of the gate of the current controlling transistor either. Therefore, cause of variation is decreased, and image quality is thus enhanced to a great extent.

In addition, as there is no need to suppress off-current of a switching transistor low, manufacturing process of the transistor can be simplified, which contributes greatly to the cost reduction and improvement in yield.

This application is based on Japanese Patent Application serial No. 2003-139583 filed in Japan Patent Office on May 16, 2003, and Japanese Patent Application serial No. 2003-174050 filed in Japan Patent Office on Jun. 18, 2003, the contents of which are hereby incorporated by reference.

Although the invention has been fully described by way of Embodiment Modes and Embodiments with reference to the accompanying drawings, it is to be understood that various changes and modifications will be apparent to those skilled in the art. Therefore, unless otherwise such changes and modifications depart from the scope of the invention hereinafter defined, they should be constructed as being included therein.

What is claimed is:

1. A light emitting device comprising:
a light emitting element formed over a substrate;
a first transistor determining a current value flowing in the light emitting element;
a second transistor selecting a light emission or non-emission of the light emitting element according to a video signal;
a third transistor controlling an input of the video signal; and
a fourth transistor bringing the light emitting element into a non-light emission state regardless of the video signal,
wherein the light emitting element, the first transistor and the second transistor are electrically connected in series between a first power supply and a second power supply,
wherein one of source and drain of the first transistor is directly connected to the light emitting element,
wherein a gate electrode of the first transistor and a gate electrode of the third transistor are each electrically connected to a first scan line,
wherein the first transistor and the second transistor have a same polarity, and
wherein the first transistor is configured to be operated in a saturation region and the second transistor is configured to be operated in a linear region.

2. A light emitting device according to claim 1, wherein the first transistor has an opposite polarity to that of the third transistor.

3. A light emitting device according to claim 1, wherein each of the first transistor and the second transistor has a P-type polarity, and a threshold voltage of the first transistor is higher than a threshold voltage of the second transistor.

4. A light emitting device according to claim 1, wherein each of the first transistor and the second transistor has an N-type polarity, and a threshold voltage of the first transistor is lower than a threshold voltage of the second transistor.

5. A light emitting device according to claim 1, wherein the first transistor is a depletion mode transistor.

6. A light emitting device according to claim 1, wherein a channel length of the first transistor is longer than its channel width, and a channel length of the second transistor is equal to or shorter than its channel width.

7. A light emitting device according to claim 6, wherein a ratio of the channel length to the channel width of the first transistor is five or more.

8. A light emitting device according to claim 1, wherein the light emitting device is incorporated into at least one selected from the group consisting of a display, a mobile computer, a game machine, and a cellular phone.

9. A light emitting device comprising:
a light emitting element formed over a substrate;
a first transistor determining a current value flowing in the light emitting element;
a second transistor selecting a light emission or non-emission of the light emitting element according to a video signal;
a third transistor controlling an input of the video signal;
a fourth transistor bringing the light emitting element into a non-light emission state regardless of the video signal; and
a first scan line and a second scan line;
wherein the first transistor, the second transistor and the light emitting element are electrically connected in series,
wherein one of source and drain of the first transistor is directly connected to the light emitting element,
wherein a gate electrode of the third transistor and a gate electrode of the first transistor are electrically connected to the first scan line,
wherein a gate electrode of the fourth transistor is electrically connected to the second scan line,
wherein the first transistor and the second transistor have a same polarity, and
wherein the first transistor is configured to be operated in a saturation region and the second transistor is configured to be operated in a linear region.

10. A light emitting device according to claim 9, wherein the first transistor has an opposite polarity to that of the third transistor.

11. A light emitting device according to claim 9, wherein each of the first transistor and the second transistor has a P-type polarity, and a threshold voltage of the first transistor is higher than a threshold voltage of the second transistor.

12. A light emitting device according to claim 9, wherein each of the first transistor and the second transistor has an N-type polarity, and a threshold voltage of the first transistor is lower than a threshold voltage of the second transistor.

13. A light emitting device according to claim 9, wherein the first transistor is a depletion mode transistor.

14. A light emitting device according to claim 9, wherein a channel length of the first transistor is longer than its channel width, and a channel length of the second transistor is equal to or shorter than its channel width.

15. A light emitting device according to claim 14, wherein a ratio of the channel length to the channel width of the first transistor is five or more.

16. A light emitting device according to claim 9, wherein the light emitting device is incorporated into at least one selected from the group consisting of a display, a mobile computer, a game machine, and a cellular phone.

* * * * *